United States Patent
Honke et al.

(10) Patent No.: US 9,978,651 B2
(45) Date of Patent: May 22, 2018

(54) SILICON CARBIDE SINGLE CRYSTAL SUBSTRATE, SILICON CARBIDE SEMICONDUCTOR DEVICE, AND METHOD FOR MANUFACTURING SILICON CARBIDE SEMICONDUCTOR DEVICE

(71) Applicant: Sumitomo Electric Industries, Ltd., Osaka-shi, Osaka (JP)

(72) Inventors: Tsubasa Honke, Itami (JP); Kyoko Okita, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days. days.

(21) Appl. No.: 15/552,863

(22) PCT Filed: Jan. 21, 2016

(86) PCT No.: PCT/JP2016/051645
§ 371 (c)(1),
(2) Date: Aug. 23, 2017

(87) PCT Pub. No.: WO2016/181667
PCT Pub. Date: Nov. 17, 2016

(65) Prior Publication Data
US 2018/0033703 A1    Feb. 1, 2018

(30) Foreign Application Priority Data

May 11, 2015    (JP) .................................. 2015-096565

(51) Int. Cl.
*H01L 21/304*  (2006.01)
*H01L 21/66*  (2006.01)
(Continued)

(52) U.S. Cl.
CPC ............... *H01L 22/20* (2013.01); *B24C 1/08* (2013.01); *C23C 14/0682* (2013.01);
(Continued)

(58) Field of Classification Search
CPC .............. H01L 22/12; H01L 21/02013; H01L 29/66053; H01L 21/304
(Continued)

(56) References Cited

U.S. PATENT DOCUMENTS

2007/0066036 A1* 3/2007 Schauer .................. C30B 25/02
438/478
2010/0176491 A1* 7/2010 Haberecht ............. C30B 23/025
257/618
(Continued)

FOREIGN PATENT DOCUMENTS

JP    2012-45690 A    3/2012
JP    2016210680 A  * 12/2016 ............. C30B 29/36

*Primary Examiner* — George Fourson, III
(74) *Attorney, Agent, or Firm* — Drinker Biddle & Reath LLP

(57) ABSTRACT

A silicon carbide single crystal substrate includes a first main surface and a second main surface opposite to the first main surface. The first main surface includes a central square region and an outer square region. When viewed in a thickness direction, each of the central square region and the outer square region has a side having a length of 15 mm. The first main surface has a maximum diameter of not less than 100 mm. The silicon carbide single crystal substrate has a TTV of not more than 5 μm. A value obtained by dividing a LTIR in the central square region by a LTV in the central square region is not less than 0.8 and not more than 1.2. A value obtained by dividing a LTV in the outer square region by the LTV in the central square region is not less than 1 and not more than 3.

7 Claims, 10 Drawing Sheets

(51) Int. Cl.
*C23C 14/06* (2006.01)
*C23C 14/34* (2006.01)
*C23C 14/58* (2006.01)
*C30B 29/36* (2006.01)
*C30B 25/20* (2006.01)
*H01L 21/027* (2006.01)
*H01L 21/306* (2006.01)
*H01L 29/66* (2006.01)
*B24C 1/08* (2006.01)
*C30B 33/02* (2006.01)
*H01L 29/78* (2006.01)
*H01L 29/16* (2006.01)
*H01L 21/02* (2006.01)

(52) U.S. Cl.
CPC .......... *C23C 14/34* (2013.01); *C23C 14/5806* (2013.01); *C30B 25/20* (2013.01); *C30B 29/36* (2013.01); *C30B 33/02* (2013.01); *H01L 21/027* (2013.01); *H01L 21/30625* (2013.01); *H01L 29/66068* (2013.01); *H01L 21/02013* (2013.01); *H01L 21/304* (2013.01); *H01L 22/12* (2013.01); *H01L 29/1608* (2013.01); *H01L 29/66053* (2013.01); *H01L 29/7802* (2013.01)

(58) Field of Classification Search
USPC .......................................... 148/33; 438/693
See application file for complete search history.

(56) References Cited

U.S. PATENT DOCUMENTS

| | | | |
|---|---|---|---|
| 2011/0294233 A1* | 12/2011 | Nakata | B24B 1/00 438/7 |
| 2014/0117380 A1* | 5/2014 | Loboda | H01L 21/30625 257/77 |
| 2015/0170928 A1* | 6/2015 | Nakayama | C01B 31/36 428/141 |
| 2015/0303050 A1* | 10/2015 | Sasaki | H01L 21/02024 438/692 |
| 2016/0133465 A1* | 5/2016 | Sasaki | B24B 37/08 438/693 |
| 2016/0181375 A1* | 6/2016 | Horii | H01L 21/02529 257/77 |

* cited by examiner

SILICON CARBIDE SINGLE CRYSTAL SUBSTRATE, SILICON CARBIDE SEMICONDUCTOR DEVICE, AND METHOD FOR MANUFACTURING SILICON CARBIDE SEMICONDUCTOR DEVICE

TECHNICAL FIELD

The present disclosure relates to a silicon carbide single crystal substrate, a silicon carbide semiconductor device, and a method for manufacturing the silicon carbide semiconductor device.

BACKGROUND ART

Japanese Patent Laying-Open No. 2012-45690 (Patent Document 1) discloses a method for polishing a compound semiconductor wafer using an abrasive material and slurry containing abrasive grains.

CITATION LIST

Patent Document

PTD 1: Japanese Patent Laying-Open No. 2012-45690

SUMMARY OF INVENTION

Technical Problem

An object of the present disclosure is to provide a silicon carbide single crystal substrate, a silicon carbide semiconductor device, and a method for manufacturing the silicon carbide semiconductor device so as to achieve suppression of position deviation of a mask pattern in a photolithography process.

Solution to Problem

A silicon carbide single crystal substrate according to the present disclosure includes a first main surface and a second main surface opposite to the first main surface. The first main surface includes: a central square region surrounded by a square having a center corresponding to an intersection between the first main surface and a straight line that passes through a center of gravity of the silicon carbide single crystal substrate and that is parallel to a thickness direction of the silicon carbide single crystal substrate; and an outer square region surrounded by a square that has a side parallel to a straight line perpendicular to a straight line connecting the intersection to a certain position on an outer edge of the first main surface and that has a center corresponding to a position separated away by 10.5 mm from the certain position toward the intersection. When viewed in the thickness direction, each of the central square region and the outer square region has a side having a length of 15 mm. The first main surface has a maximum diameter of not less than 100 mm. The silicon carbide single crystal substrate has a TTV of not more than 5 μm. A value obtained by dividing a LTIR in the central square region by a LTV in the central square region is not less than 0.8 and not more than 1.2. A value obtained by dividing a LTV in the outer square region by the LTV in the central square region is not less than 1 and not more than 3.

Advantageous Effects of Invention

According to the present disclosure, there can be provided a silicon carbide single crystal substrate, a silicon carbide semiconductor device, and a method for manufacturing the silicon carbide semiconductor device so as to achieve suppression of position deviation of a mask pattern in a photolithography process.

DESCRIPTION OF EMBODIMENTS

Figure 1:
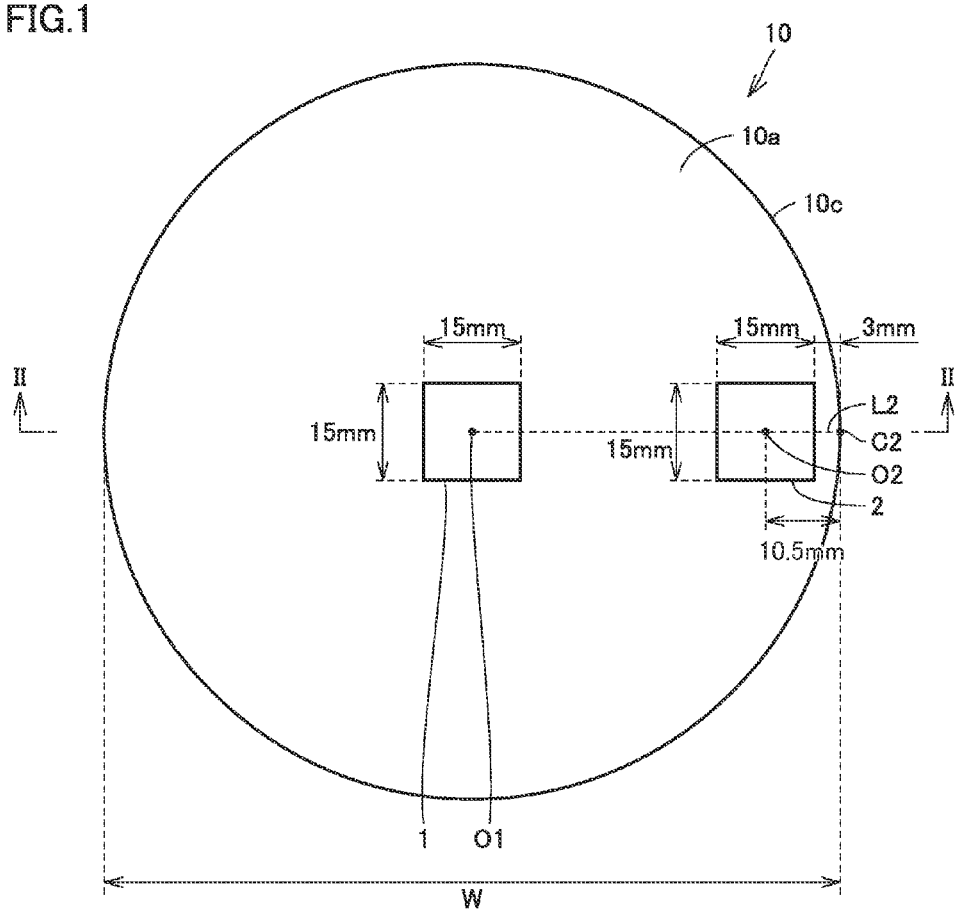
FIG. 1 is a schematic plan view showing a structure of a silicon carbide single crystal substrate according to a first embodiment.

In a photolithography process for a semiconductor device, while one main surface of a silicon carbide single crystal substrate is fixed to, for example, a vacuum chuck, a mask pattern is formed on the other main surface. If the thickness of the silicon carbide single crystal substrate in, for example, the radial direction is varied, flatness of the other main surface of the silicon carbide single crystal substrate is deteriorated when the one main surface of the silicon carbide single crystal substrate is fixed on the surface of the chuck. Accordingly, a position of the mask pattern to be formed on the other main surface may be deviated from a desired position.

A main surface of a silicon carbide single crystal substrate is normally polished using a rotating surface plate. A circumferential speed at the outer circumferential side of the surface plate is faster than the circumferential speed at the central side thereof. Accordingly, a polishing rate at the outer circumferential side of the silicon carbide single crystal substrate is higher than a polishing rate at the central side thereof. As a result, the thickness of the silicon carbide single crystal substrate is likely to be thinner from the central side toward the outer circumferential side. When one main surface of the silicon carbide single crystal substrate having a thickness becoming thinner from the central side toward the outer circumferential side is fixed on the surface of the chuck in the photolithography process, the other main surface becomes less flat particularly at the outer circumferential side thereof. Accordingly, position deviation of a mask pattern is more likely to be notable particularly at the outer circumferential side of the other main surface.

(1) A silicon carbide single crystal substrate 10 according to an embodiment includes a first main surface 10a and a second main surface 10b opposite to first main surface 10a. First main surface 10a includes: a central square region 1 surrounded by a square having a center corresponding to an intersection O1 between first main surface 10a and a straight line L1 that passes through a center of gravity G of silicon carbide single crystal substrate 10 and that is parallel to a thickness direction TD of silicon carbide single crystal substrate 10; and an outer square region 2 surrounded by a square that has a side parallel to a straight line perpendicular to a straight line L2 connecting intersection O1 to a certain position on an outer edge 10c of first main surface 10a and that has a center O2 corresponding to a position separated away by 10.5 mm from the certain position toward the intersection. When viewed in thickness direction TD, each of central square region 1 and outer square region 2 has a side having a length of 15 mm. First main surface 10a has a maximum diameter W of not less than 100 mm. Silicon carbide single crystal substrate 10 has a TTV of not more than 5 μm. A value obtained by dividing a LTIR in central square region 1 by a LTV in central square region 1 is not less than 0.8 and not more than 1.2. A value obtained by dividing a LTV in outer square region 2 by the LTV in central square region 1 is not less than 1 and not more than 3.

In accordance with silicon carbide single crystal substrate 10 according to (1), the value obtained by dividing the LTIR in the central square region by the LTV in the central square region is not less than 0.8 and not more than 1.2. As described below, the LTIR is different from the LTV in terms of its reference plane. Therefore, there may be a case where the LTIR is small and the LTV is large, or a case where the LTIR is large and the LTV is small. Hence, by using only one of these parameters, it is difficult to determine the flatness with precision. Therefore, by calculating a ratio of the LTIR and the LTV and controlling the ratio to fall within the above-described range, the flatness in the central square region can be controlled with precision. Moreover, the value obtained by dividing the LTV in the outer square region by the LTV in the central square region is not less than 1 and not more than 3. By controlling the flatness in the outer square region to be comparable to that in the central square region, the flatness in the outer square region can be excellent. As a result, position deviation of a mask pattern can be suppressed in the photolithography process.

(2) In silicon carbide single crystal substrate 10 according to (1) in accordance with the embodiment, maximum diameter W may be not less than 150 mm.

(3) In silicon carbide single crystal substrate 10 according to (2) in accordance with the embodiment, maximum diameter W may be not less than 200 mm.

(4) In silicon carbide single crystal substrate 10 according to any one of (1) to (3) in accordance with the embodiment, a flaw having a depth of not less than 0.5 nm in thickness direction TD may be formed in first main surface 10a. The flaw may have an area density of not more than $0.085/cm^2$.

(5) In silicon carbide single crystal substrate 10 according to any one of (1) to (4) in accordance with the embodiment, a value obtained by dividing a LTIR in outer square region 2 by the LTV in outer square region 2 is not less than 0.8 and not more than 1.2. As described below, the LTIR is different from the LTV in terms of its reference plane. Therefore, there may be a case where the LTIR is small and the LTV is large, or a case where the LTIR is large and the LTV is small. Hence, by only using one of these parameters, it is difficult to determine the flatness with precision. Therefore, by calculating a ratio of the LTIR and the LTV and controlling the ratio to fall within the above-described range, the flatness in the outer square region can be controlled with precision.

(6) A silicon carbide semiconductor device 100 according to an embodiment includes silicon carbide single crystal substrate 10 recited in any one of (1) to (5).

(7) A silicon carbide semiconductor device 100 according to an embodiment includes the following steps. Silicon carbide single crystal substrate 10 recited in any one of (1) to (5) is prepared. Silicon carbide single crystal substrate 10 is processed.

Details of Embodiments

The following describes an embodiment of the present invention with reference to figures. It should be noted that in the below-described figures, the same or corresponding portions are given the same reference characters and are not described repeatedly. Regarding crystallographic indications in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

First Embodiment: Silicon Carbide Single Crystal Substrate

First, the following describes a configuration of a silicon carbide single crystal substrate according to a first embodiment.

Figure 2:
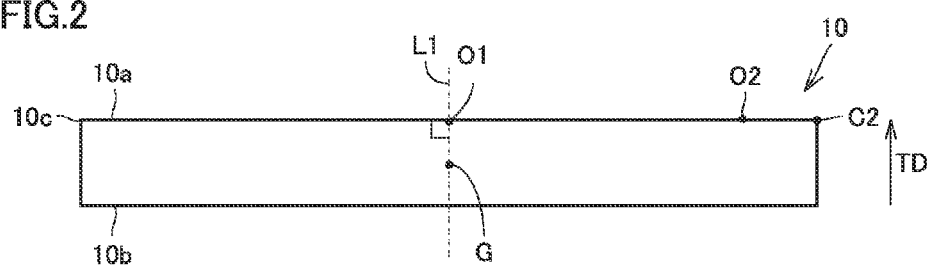
FIG. 2 is a schematic longitudinal cross sectional view taken along a II-II line of FIG. 1.

As shown in FIG. 1 and FIG. 2, a silicon carbide single crystal substrate 10 according to the first embodiment includes: a first main surface 10a; and a second main surface 10b opposite to first main surface 10a. Silicon carbide single crystal substrate 10 is composed of hexagonal silicon carbide of polytype 4H, for example. First main surface 10a corresponds to a {0001} plane or a plane angled off by about 4° or less relative to the {0001} plane, for example. First main surface 10a may correspond to a (0001) plane or a plane angled off by about 4° or less relative to the (0001) plane, and second main surface 10b may correspond to a (000-1) plane or a plane angled off by 4° or less relative to the (000-1) plane. Alternatively, first main surface 10a may correspond to the (000-1) plane or the plane angled off by about 4° or less relative to the (000-1) plane, and second main surface 10b may correspond to the (0001) plane or the plane angled off by 4° or less relative to the (0001) plane.

As shown in FIG. 1, first main surface 10a has a substantially circular shape, for example. First main surface 10a includes a central square region 1 and an outer square region 2. Central square region 1 is a region surrounded by a square having a center corresponding to an intersection O1 between first main surface 10a and a straight line L1 that passes through a center of gravity G of silicon carbide single crystal substrate 10 (see FIG. 2) and that is parallel to a thickness direction TD of silicon carbide single crystal substrate 10. Central square region 1 is a region surrounded by a square having intersection O1 as a rotational symmetry center when first main surface 10a is viewed in thickness direction TD. Outer square region 2 is a region surrounded by a square that has a side parallel to a straight line perpendicular to a straight line L2 connecting intersection O1 to a certain position C2 on an outer edge 10c of first main surface 10a and that has a center O2 corresponding to a position separated away by 10.5 mm from certain position C2 toward the intersection. Outer square region 2 is a region surrounded by a square having center O2 as a rotational symmetry center when first main surface 10a is viewed in thickness direction TD.

Thickness direction TD is a direction from second main surface 10b toward first main surface 10a. When first main surface 10a is a flat surface, thickness direction TD is a direction perpendicular to first main surface 10a. When first main surface 10a is a curved surface, thickness direction TD may be a direction perpendicular to a least squares plane of first main surface 10a, for example. It should be noted that the least squares plane refers to a plane in which a minimum value of the sum of squares of the shortest distances between coordinates $(x_i, y_i, z_i)$ representing a position of an observed object on a surface and a certain plane (ax+by+cz+d=0) is obtained by determining a, b, c, and d.

When viewed in thickness direction TD, each of central square region 1 and outer square region 2 has a side having a length of 15 mm. When viewed in thickness direction TD, central square region 1 has sides parallel to straight line L2, and sides perpendicular to both straight line L2 and straight line L1. Similarly, when viewed in thickness direction TD, outer square region 2 has sides parallel to straight line L2, and sides perpendicular to both straight line L2 and straight line L1.

When viewed in thickness direction TD, first main surface 10a has a maximum diameter W of not less than 100 mm. Maximum diameter W may be not less than 150 mm, or may be not less than 200 mm. Maximum diameter W is the longest linear distance between two different points on the circumferential edge of first main surface 10a.

(TTV: Total Thickness Variation)

$$TTV=|T1-T2| \quad \text{(Formula 1)}$$

Figure 3:
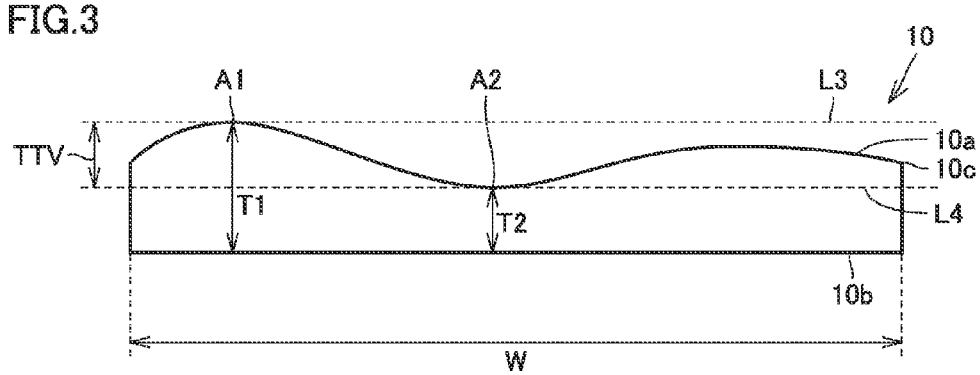
FIG. 3 is a schematic longitudinal cross sectional view of the silicon carbide single crystal substrate to illustrate a method for measuring a TTV.

A TTV is measured in the following procedure, for example. First, second main surface 10b of silicon carbide single crystal substrate 10 is entirely adsorbed onto a flat adsorption surface. Next, an image of the whole of first main surface 10a is obtained optically. As shown in FIG. 3 and Formula 1, the TTV is a value obtained by subtracting a height T2 from a height T1 with second main surface 10b being entirely adsorbed on the flat adsorption surface. Height T1 is a height from second main surface 10b to a maximum point A1 of first main surface 10a, and height T2 is a height from second main surface 10b to a minimum point A2 of first main surface 10a. Specifically, the TTV is a value obtained by subtracting the shortest distance between second main surface 10b and first main surface 10a from the longest distance between second main surface 10b and first main surface 10a in the direction perpendicular to second main surface 10b. In other words, the TTV is a distance between a plane L3 passing through maximum point A1 and parallel to second main surface 10b and a plane L4 passing through minimum point A2 and parallel to second main surface 10b. Silicon carbide single crystal substrate 10 in the present embodiment has a TTV of not more than 5 μm. The TTV is preferably not more than 3 μm, more preferably, not more than 1.5 μm.

(LTIR: Local Total Indicated Reading)

$$LTIR=|T3|+|T4| \quad \text{(Formula 2)}$$

Figure 4:
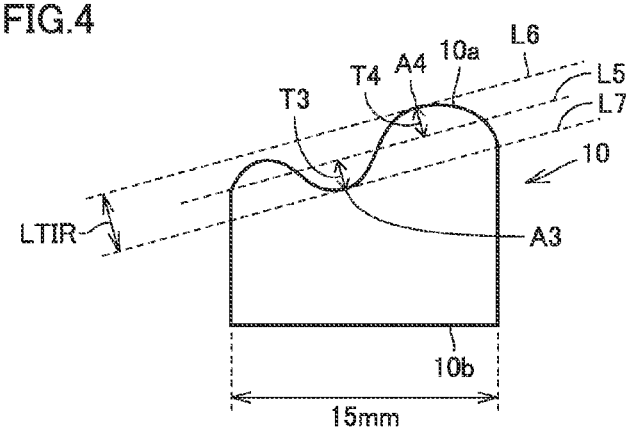
FIG. 4 is a schematic longitudinal cross sectional view of the silicon carbide single crystal substrate to illustrate a method for measuring a LTIR.

A LTIR is measured in the following procedure, for example. First, second main surface 10b of silicon carbide single crystal substrate 10 is entirely adsorbed onto a flat adsorption surface. Next, an image of first main surface 10a at a certain local region (such as central square region 1 and outer square region 2) is obtained optically. Next, a least squares plane L5 of first main surface 10a is determined by calculation. As shown in FIG. 4 and Formula 2, the LTIR is a value obtained by adding a height T4 to a height T3 with second main surface 10b being entirely adsorbed on the flat adsorption surface. Height T4 is a height from least squares plane L5 to a maximum point A4 of first main surface 10a, and height T3 is a height from least squares plane L5 to a minimum point A3 of first main surface 10a. Minimum point A3 refers to a position, at which a distance is maximum between first main surface 10a and least squares plane L5 along the direction perpendicular to least squares plane L5, in a region of first main surface 10a located at the second main surface 10b side relative to least squares plane L5. Maximum point A4 refers to a position, at which a distance is maximum between least squares plane L5 and first main surface 10a along the direction perpendicular to least squares plane L5, in a region of first main surface 10a located opposite to the second main surface 10b side relative to least squares plane L5. In other words, the LTIR is a distance between a plane L6 passing through maximum point A4 and parallel to least squares plane L5 and a plane L7 passing through minimum point A3 and parallel to least squares plane L5. The LTIR in central square region 1 is, for example, not more than 1 μm, and is preferably not more than 0.5. The LTIR in outer square region 2 is, for example, not more than 1 μm, and is preferably not more than 0.7.

(LTV: Local Thickness Variation)

$$LTV=|T6-T5| \quad \text{(Formula 3)}$$

Figure 5:
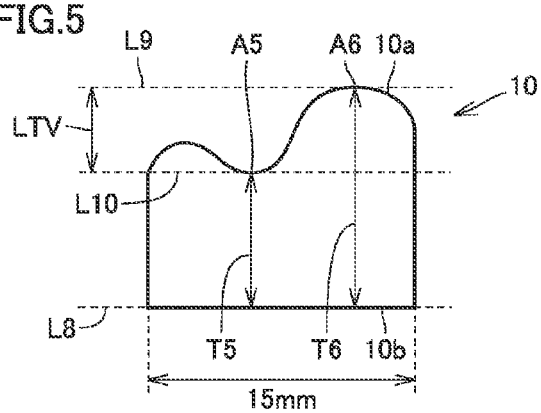
FIG. 5 is a schematic longitudinal cross sectional view of the silicon carbide single crystal substrate to illustrate a method for measuring a LTV.

A LTV is measured in the following procedure, for example. First, second main surface 10b of silicon carbide single crystal substrate 10 is entirely adsorbed onto a flat adsorption surface. Next, an image of first main surface 10a at a certain local region (such as central square region 1 and outer square region 2) is obtained optically. As shown in FIG. 5 and Formula 3, the LTV is a value obtained by subtracting a height T5 from a height T6 with second main surface 10b being entirely adsorbed on the flat adsorption surface. Height T6 is a height from second main surface 10b to a maximum point A6 of first main surface 10a, and height T5 is a height from second main surface 10b to a minimum point A5 of first main surface 10a. Specifically, the LTV is a value obtained by subtracting the shortest distance between second main surface 10b and first main surface 10a from the longest distance between second main surface 10b and first main surface 10a in the direction perpendicular to second main surface 10b. In other words, the LTV is a distance between a plane L9 passing through maximum point A6 and parallel to second main surface 10b and a plane L10 passing through minimum point A5 and parallel to second main surface 10b. The LTV in central square region 1 is, for example, not more than 1 μm, and is preferably not more than 0.5 μm. The LTV in outer square region 2 is, for example, not more than 1 μm, and is preferably not more than 0.8 μm.

Each of the TTV, LTIR, and LTV described above is an index quantitatively indicating a degree of flatness of first main surface 10a of silicon carbide single crystal substrate 10. This index can be measured by using "Tropel FlatMaster®" provided by Corning Tropel, for example.

In accordance with silicon carbide single crystal substrate 10 according to the present embodiment, a value obtained by dividing the LTIR in central square region 1 by the LTV in central square region 1 is not less than 0.8 and not more than 1.2. Preferably, a value obtained by dividing the LTIR in central square region 1 by the LTV in central square region 1 is not less than 0.9 and not more than 1.1.

In accordance with silicon carbide single crystal substrate 10 according to the present embodiment, a value obtained by dividing the LTV in outer square region 2 by the LTV in central square region 1 is not less than 1 and not more than 3. Preferably, a value obtained by dividing the LTV in outer square region 2 by the LTV in central square region 1 is not less than 1 and not more than 2.

In accordance with silicon carbide single crystal substrate 10 according to the present embodiment, a value obtained by dividing the LTIR in outer square region 2 by the LTV in outer square region 2 is not less than 0.8 and not more than 1.2. Preferably, a value obtained by dividing the LTIR in outer square region 2 by the LTV in outer square region 2 is not less than 0.9 and not more than 1.1.

Figure 6:
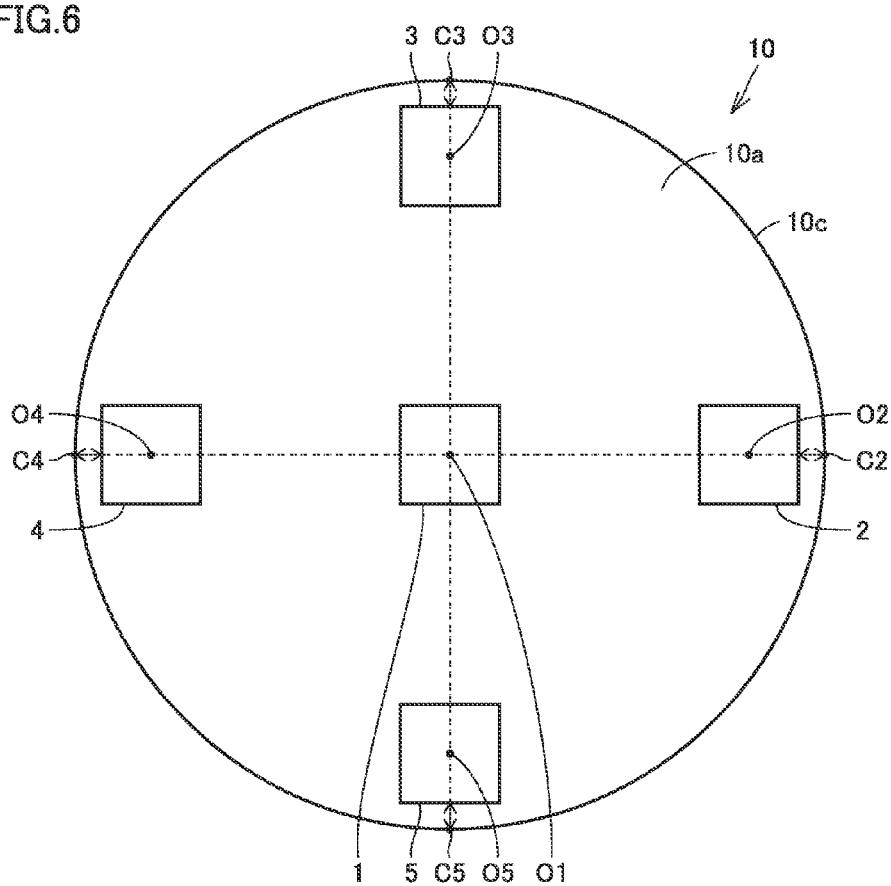
FIG. 6 is a schematic plan view showing the structure of the silicon carbide single crystal substrate according to the first embodiment.

As shown in FIG. 6, first main surface 10a may further include a second outer square region 3, a third outer square region 4, and a fourth outer square region 5. Third outer square region 4 is located opposite to outer square region 2 when viewed from central square region 1. Third outer square region 4 is a region surrounded by a square that has a side parallel to a straight line perpendicular to a straight line connecting intersection O1 to a certain position C4 on outer edge 10c of first main surface 10a and that has a center O4 corresponding to a position separated away by 10.5 mm from certain position C4 toward intersection O1.

Second outer square region 3 and fourth outer square region 5 cross a straight line perpendicular to a straight line passing through center O2 and center O4 when viewed in thickness direction TD. Second outer square region 3 is a region surrounded by a square that has a side parallel to a straight line perpendicular to a straight line connecting intersection O1 to a certain position C3 on outer edge 10c of first main surface 10a and that has a center O3 corresponding to a position separated away by 10.5 mm from certain position C3 toward intersection O1. Similarly, fourth outer square region 5 is a region surrounded by a square that has a side parallel to a straight line perpendicular to a straight line connecting intersection O1 to a certain position C5 on outer edge 10c of first main surface 10a and that has a center O5 corresponding to a position separated away by 10.5 mm from certain position C5 toward intersection O1. Each of second outer square region 3, third outer square region 4, and fourth outer square region 5 has a side of 15 mm.

A value obtained by dividing a LTV in second outer square region 3 by the LTV in central square region 1 is preferably not less than 1 and not more than 3, more preferably, not less than 1 and not more than 2. Similarly, a value obtained by dividing a LTV in third outer square region 4 by the LTV in central square region 1 is preferably not less than 1 and not more than 3, more preferably, not less than 1 and not more than 2. Similarly, a value obtained by dividing a LTV in fourth outer square region 5 by the LTV in central square region 1 is preferably not less than 1 and not more than 3, more preferably, not less than 1 and not more than 2.

A value obtained by dividing a LTIR in second outer square region 3 by the LTV in second outer square region 3 is preferably not less than 0.8 and not more than 1.2, more preferably, not less than 0.9 and not more than 1.1. A value obtained by dividing a LTIR in third outer square region 4 by the LTV in third outer square region 4 is preferably not less than 0.8 and not more than 1.2, more preferably, not less than 0.9 and not more than 1.1. A value obtained by dividing a LTIR in fourth outer square region 5 by the LTV in fourth outer square region 5 is preferably not less than 0.8 and not more than 1.2, more preferably, not less than 0.9 and not more than 1.1.

Figure 7:
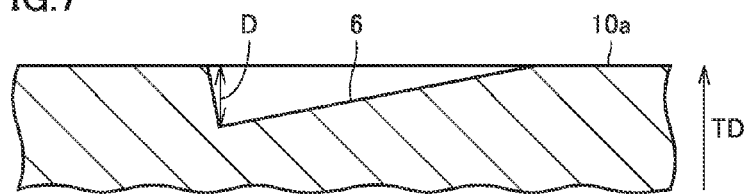
FIG. 7 is a partially enlarged schematic longitudinal cross sectional view showing the structure of the silicon carbide single crystal substrate according to the first embodiment.

As shown in FIG. 7, a flaw 6 may be formed in first main surface 10a. Flaw 6 may be a scratch formed by first main surface 10a being partially cut by diamond abrasive grains during polishing of first main surface 10a. As shown in FIG. 6, when viewed in thickness direction TD, flaw 6 may be a line-like flaw extending along a direction in which first main surface 10a extends. A depth of flaw 6 in thickness direction TD of silicon carbide single crystal substrate 10 is not less than 0.5 nm, for example. An area density of the flaw in first main surface 10a is not more than $0.085/cm^2$, for example. The size of flaw 6 in thickness direction TD may be smaller than the size of flaw 6 in the direction along first main surface 10a. The area density of flaw 6 can be measured using a differential interference microscope, for example.

It should be noted that first main surface 10a is a surface on which an epitaxial layer is to be forming when manufacturing a silicon carbide semiconductor device using silicon carbide single crystal substrate 10. When viewed from an intermediate position between first main surface 10a and second main surface 10b, a gate oxide film 36 (see FIG. 12) of the silicon carbide semiconductor device such as a MOSFET (Metal Oxide Semiconductor Field Effect Transistor) is to be formed at the first main surface 10a side. Details of the silicon carbide semiconductor device will be described later.

Next, the following describes a method for manufacturing a silicon carbide single crystal substrate according to the embodiment.

Silicon carbide single crystal substrate 10 is prepared by slicing, using a wire saw, an ingot composed of silicon carbide single crystal produced by a sublimation method, for example. Silicon carbide single crystal substrate 10 is composed of hexagonal silicon carbide of polytype 4H, for example. Silicon carbide single crystal substrate 10 has first main surface 10a and second main surface 10b opposite to first main surface 10a. First main surface 10a corresponds to the {0001} plane or the plane angled off by about 4° or less relative to the {0001} plane, for example. For example, after first main surface 10a and second main surface 10b are ground, first main surface 10a and second main surface 10b are subjected to mechanical polishing and CMP (Chemical Mechanical Polishing).

Figure 8:
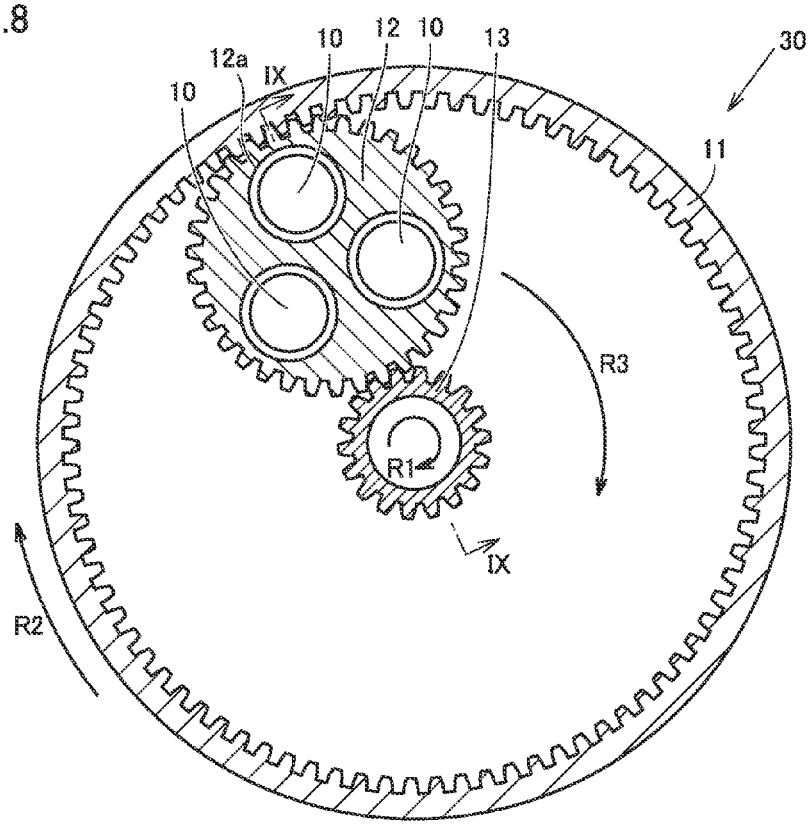
FIG. 8 is a schematic lateral cross sectional view showing a structure of a polishing apparatus for the silicon carbide single crystal substrate according to the first embodiment.
Figure 9:
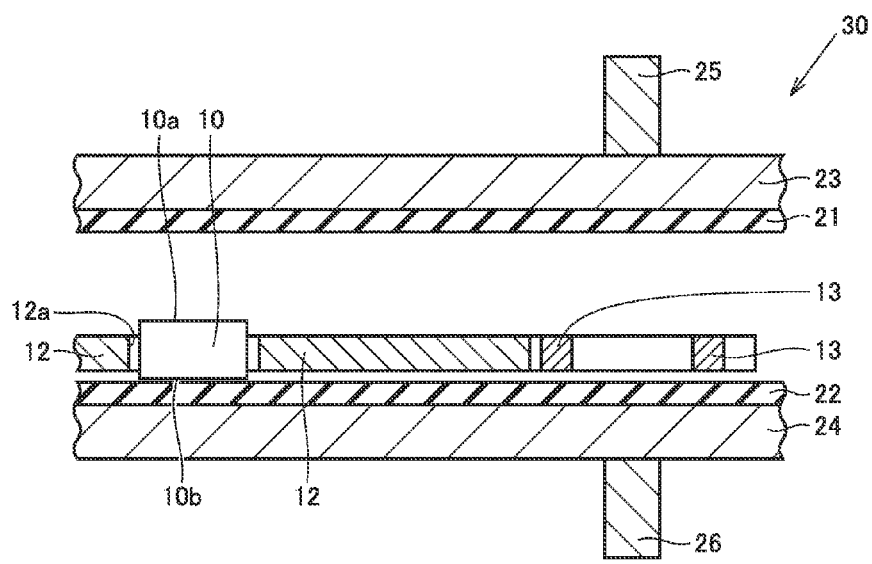
FIG. 9 is a schematic longitudinal cross sectional view showing a first step of a method for manufacturing the silicon carbide single crystal substrate according to the first embodiment.

With reference to FIG. 8 and FIG. 9, the following describes a configuration of a polishing apparatus. A polishing apparatus 30 is a CMP apparatus, for example. As shown in FIG. 8 and FIG. 9, polishing apparatus 30 mainly includes an outer gear 11, a carrier 12, an inner gear 13, an upper surface plate 23, a lower surface plate 24, polishing cloths 21, 22, and shafts 25, 26. Carrier 12 is provided between inner gear 13 and outer gear 11. Carrier 12 is provided with a plurality of pockets 12a. Polishing cloth 21 is fixed to upper surface plate 23. Upper surface plate 23 is fixed to shaft 25. Polishing cloth 22 is fixed to lower surface plate 24. Lower surface plate 24 is fixed to shaft 26.

As each of polishing cloths 21, 22, a nonwoven fabric can be used, for example. Each of polishing cloths 21, 22 has an Asker-C hardness of not less than 70 and not more than 90, for example. The Asker-C hardness is a hardness measured by an Asker-C hardness meter defined in the Society of Rubber Industry, Japan Standard (SRIS) 0101. Each of polishing cloths 21, 22 has a compression ratio of not less than 2% and not more than 6%, for example. The compression ratio is measured based on "JIS L 1096". As each of upper surface plate 23 and lower surface plate 24, a metal such as stainless steel can be used, for example. When the Asker-C hardness of each of polishing cloths 21, 22 is not less than 70 and not more than 90 and the compression ratio of each of polishing cloths 21, 22 is not less than 2% and not more than 6%, polishing cloths 21, 22 are not deformed much along the shapes of the surfaces (i.e., first main surface 10a and second main surface 10b) of silicon carbide single crystal substrate 10. Therefore, polishing cloths 21, 22 are in point contact with only projections of the surfaces, and are substantially in no contact with recesses thereof. As a result, the projections of the surfaces are polished more preferentially than the recesses thereof. Accordingly, it is considered that the surfaces are more likely to be flat.

Figure 10:
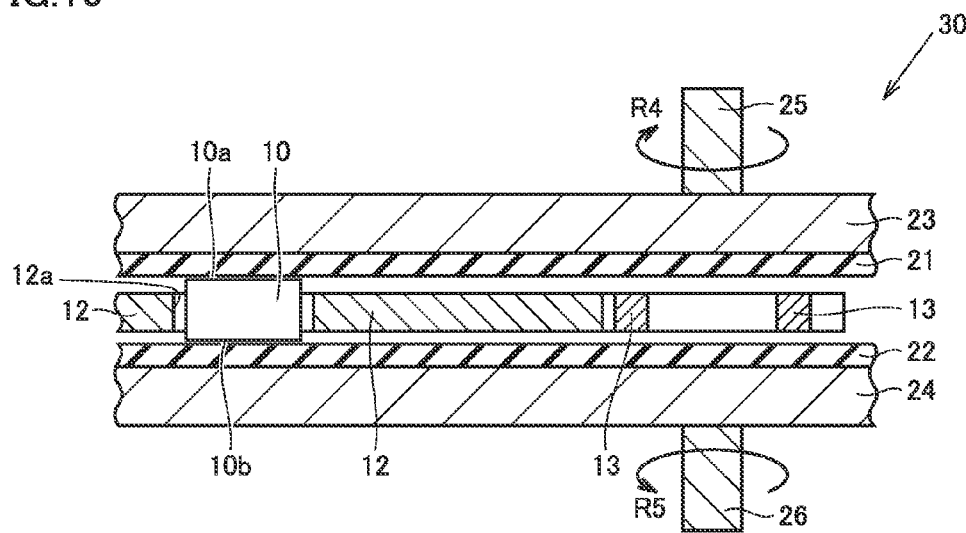
FIG. 10 is a schematic longitudinal cross sectional view showing a second step of the method for manufacturing the silicon carbide single crystal substrate according to the first embodiment.

As shown in FIG. 8 and FIG. 9, silicon carbide single crystal substrate 10 is disposed in each of the plurality of pockets 12a. As shown in FIG. 10, first main surface 10a faces polishing cloth 21, and second main surface 10b faces polishing cloth 22. As shown in FIG. 8, outer gear 11 is rotated in a rotation direction R2, and inner gear 13 is rotated in a rotation direction R1. Accordingly, carrier 12 rotates around inner gear 13 in a rotation direction R3 while revolving on its axis. As carrier 12 moves, silicon carbide single crystal substrate 10 rotates around inner gear 13.

Slurry is supplied to between first main surfaces 10a and polishing cloth 21 and between second main surface 10b and polishing cloth 22. The slurry includes diamond abrasive grains and a solution, for example. The solution contains a solvent and a dispersant. The solvent is ethylene glycol, for example. The dispersant can serve to adjust pH and refractive index of the solution.

Figure 11:
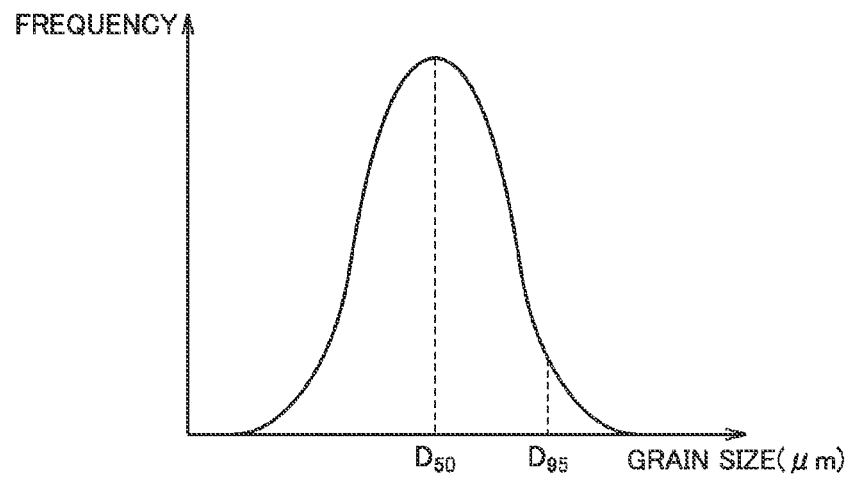
FIG. 11 shows a relation between grain sizes and frequency of diamond abrasive grains.

FIG. 11 shows a relation between grain sizes and frequency of the diamond abrasive grains. It is defined that $D_{50}$ represents a grain size of 50% (half) of the total number of diamond abrasive grains when the diamond abrasive grains are added in an order from one with the smallest grain size. Similarly, it is defined that $D_{95}$ represents a grain size of 95% of the total number of diamond abrasive grains. In the present embodiment, the grain sizes of the diamond abrasive grains are adjusted to achieve a $D_{50}$ of not more than 1 μm and a $D_{95}$ of not more than 1.8 μm. By reducing the grain sizes of the diamond abrasive grains, flaw 6 (see FIG. 7) can be suppressed from being formed in the surface.

The refractive index of the solution of the slurry is not less than 1.36 and not more than 1.37, for example. The refractive index can be measured using a digital refractometer (model number: RX-5000α-Plus) provided by ATAGO Co. Ltd, for example. Generally, a solution having a high refractive index has a high density, resulting in bad smoothness. Since polishing cloths 21, 22 each having a relatively high hardness are used in the present embodiment, a flaw is likely to be formed in the surface. Hence, by using a solution having a good smoothness (in other words, low refractive index), it is desirable to suppress formation of a flaw in the surface.

The pH (hydrogen ion exponent) of the solution is not less than 7.0 and not more than 8.5, for example. An abrasive grain concentration, which is determined by dividing the mass (gram) of the abrasive grains by the volume (liter) of the solution, is not less than 3.60 g/L and 4.00 g/L, for example. Since the diamond abrasive grains each having a relatively small grain size are used in the present embodiment, a polishing rate becomes low. Hence, by increasing the abrasive grain concentration, it is desirable to increase the polishing rate.

As shown in FIG. 10, first main surface 10a and second main surface 10b are polished simultaneously by carrier 12 revolving on its axis and rotating with polishing cloth 21 being pressed against first main surface 10a and polishing cloth 22 being pressed against second main surface 10b. A load applied to each of first main surface 10a and second main surface 10b is 300 g/cm$^2$, for example. Upper surface plate 23 and polishing cloth 21 may be unmoved or may be rotated around shaft 25 in a rotation direction R4, for example. Lower surface plate 24 and polishing cloth 22 are rotated around shaft 26 in a rotation direction R5, for example. Both of upper surface plate 23 and lower surface plate 24 may be rotated or one of upper surface plate 23 and lower surface plate 24 may be rotated and the other may be unmoved. For example, when upper surface plate 23 and polishing cloth 21 are unmoved, carrier 12 is rotated at 10 rpm, and lower surface plate 24 and polishing cloth 22 are rotated at 30 rpm, a rotating speed of upper surface plate 23 relative to silicon carbide single crystal substrate 10 is 10 rpm, whereas a rotating speed of lower surface plate 24 relative to silicon carbide single crystal substrate 10 is 20 rpm (30 rpm–10 rpm).

The speed of polishing cloth 21 relative to silicon carbide single crystal substrate 10 (i.e., speed of upper surface plate 23 relative to first main surface 10a) is desirably slower than the speed of polishing cloth 22 relative to silicon carbide single crystal substrate 10 (i.e., speed of lower surface plate 24 relative to second main surface 10b). Accordingly, flaw 6 (see FIG. 7) formed in first main surface 10a can be reduced. Moreover, roughness of first main surface 10a can be reduced. The speed of upper surface plate 23 relative to silicon carbide single crystal substrate 10 is desirably not more than ½ of the speed of lower surface plate 24 relative to silicon carbide single crystal substrate 10.

Next, the following describes function and effect of the silicon carbide single crystal substrate according to the first embodiment.

In accordance with silicon carbide single crystal substrate 10 according to the first embodiment, the value obtained by dividing the LTIR in central square region 1 by the LTV in central square region 1 is not less than 0.8 and not more than 1.2. The LTIR is different from the LTV in terms of its reference plane. Therefore, there may be a case where the LTIR is small and the LTV is large, or a case where the LTIR is large and the LTV is small. Hence, by using only one of these parameters, it is difficult to determine the flatness with precision. Therefore, by calculating a ratio of the LTIR and the LTV and controlling the ratio to fall within the above-described range, the flatness in central square region 1 can be controlled with precision. Moreover, the value obtained by dividing the LTV in outer square region 2 by the LTV in central square region 1 is not less than 1 and not more than 3. By controlling the flatness in outer square region 2 to be comparable to that in central square region 1, excellent flatness can be obtained in outer square region 2. As a result, position deviation of a mask pattern can be suppressed in the photolithography process.

Further, in accordance with silicon carbide single crystal substrate 10 according to the first embodiment, maximum diameter W is not less than 150 mm.

Further, in accordance with silicon carbide single crystal substrate 10 according to the first embodiment, maximum diameter W is not less than 200 mm.

Further, in accordance with silicon carbide single crystal substrate 10 according to the first embodiment, a flaw 6 having a depth of not less than 0.5 nm in thickness direction TD is formed in first main surface 10a. Flaw 6 has an area density of not more than $0.085/cm^2$.

Further, in accordance with silicon carbide single crystal substrate 10 according to the first embodiment, a value obtained by dividing a LTIR in outer square region 2 by the LTV in outer square region 2 is not less than 0.8 and not more than 1.2. The LTIR is different from the LTV in terms of its reference plane. Therefore, there may be a case where the LTIR is small and the LTV is large, or a case where the LTIR is large and the LTV is small. Hence, by using only one of these parameters, it is difficult to determine the flatness with precision. Therefore, by calculating a ratio of the LTIR and the LTV and controlling the ratio to fall within the above-described range, the flatness in outer square region 2 can be controlled with precision.

Second Embodiment: Silicon Carbide Semiconductor Device

Next, the following describes a configuration of a MOSFET serving as an exemplary silicon carbide semiconductor device 100 according to a second embodiment.

Figure 12:
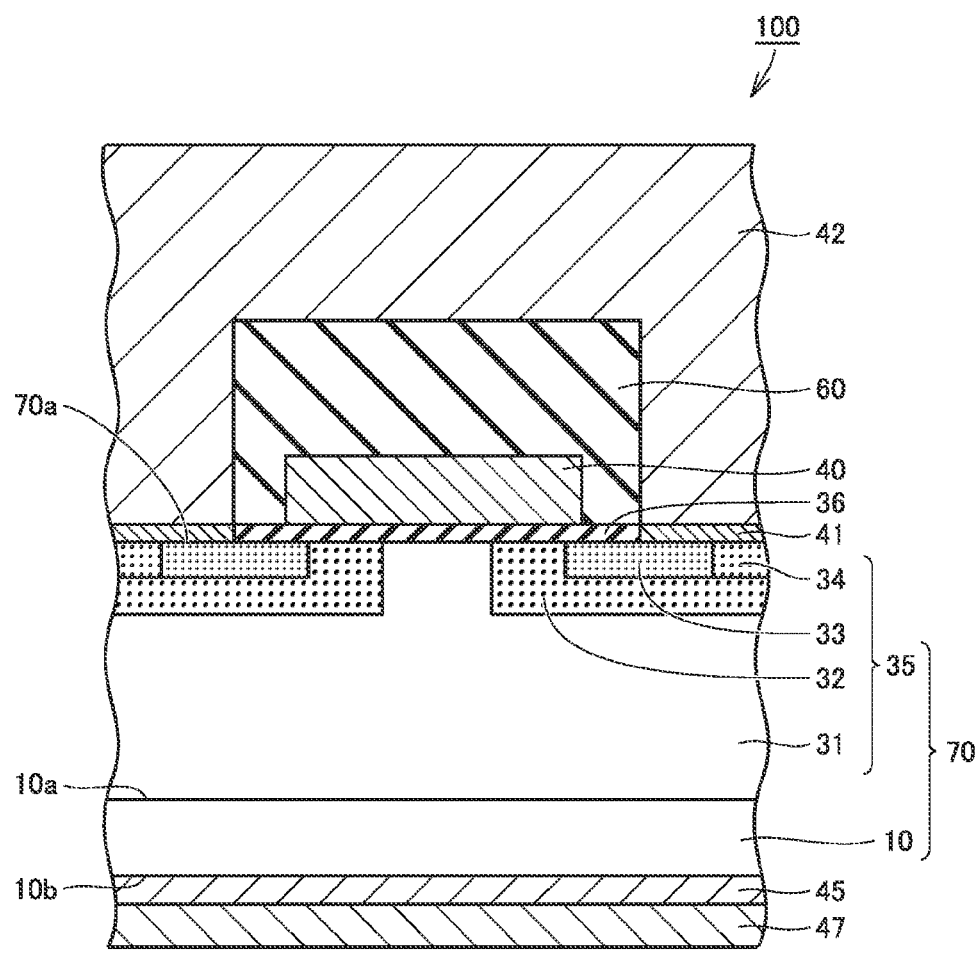
FIG. 12 is a schematic longitudinal cross section view showing a structure of a silicon carbide semiconductor device according to a second embodiment.

As shown in FIG. 12, a MOSFET 100 according to the second embodiment mainly includes a silicon carbide substrate 70, a gate oxide film 36, a gate electrode 40, an interlayer insulating film 60, source electrodes 41, a front surface protecting electrode 42, a drain electrode 45, and a backside surface protecting electrode 47. Silicon carbide substrate 70 has a silicon carbide single crystal substrate 10 and a silicon carbide epitaxial layer 35, for example. Silicon carbide single crystal substrate 10 is configured as described in the first embodiment.

Silicon carbide substrate 70 has a third main surface 70a and second main surface 10b opposite to third main surface 70a. Third main surface 70a corresponds to the {0001} plane or a plane angled off by about 4° or less relative to the {0001} plane. Preferably, third main surface 70a corresponds to the (0001) plane or the plane angled off by about 4° or less relative to the (0001) plane, whereas second main surface 10b corresponds to the (000-1) plane or the plane angled off by about 4° or less relative to the (000-1) plane. Silicon carbide single crystal substrate 10 constitutes second main surface 10b, and silicon carbide epitaxial layer 35 constitutes third main surface 70a.

Silicon carbide epitaxial layer 35 is provided on silicon carbide single crystal substrate 10. Silicon carbide epitaxial layer 35 includes a drift region 31, body regions 32, source regions 33, and contact regions 34, for example. Drift region 31 includes an n type impurity such as N (nitrogen), and has n type conductivity. The concentration of the n type impurity in drift region 31 may be lower than the concentration of the n type impurity in silicon carbide single crystal substrate 10. Each of body regions 32 includes a p type impurity such as Al (aluminum) or B (boron), and has p type (second conductivity type) conductivity. The concentration of the p type impurity in body region 32 may be higher than the concentration of the n type impurity in drift region 31.

Each of source regions 33 includes an impurity such as P (phosphorus), and has n type conductivity. Source region 33 is separated from drift region 31 by body region 32. Source region 33 forms a portion of third main surface 70a. When viewed in a direction perpendicular to third main surface 70a, source region 33 may be surrounded by body region 32. The concentration of the n type impurity in source region 33 may be higher than the concentration of the n type impurity in drift region 31.

Each of contact regions 34 includes a p type impurity such as Al (aluminum) or B (boron), and has p type (second conductivity type) conductivity. Contact region 34 is provided to extend through source region 33 and in contact with both third main surface 70a and body region 32. The concentration of the p type impurity in contact region 34 may be higher than the concentration of the p type impurity in body region 32.

Gate oxide film 36 is provided on silicon carbide substrate 70. Gate oxide film 36 is in contact with each of source region 33, body region 32, and drift region 31 on third main surface 70a. Gate oxide film 36 is composed of silicon dioxide, for example.

Gate electrode 40 is provided on gate oxide film 36. Gate electrode 40 faces each of source region 33, body region 32, and drift region 31. Gate electrode 40 is composed of a conductor such as Al or polysilicon having an impurity implanted therein.

In third main surface 70a, source electrode 41 may be provided in contact with source region 33 and contact region 34. Source electrode 41 may be in contact with gate oxide film 36. Source electrode 41 is composed of a material including Ti, Al, and Si, for example. For example, source electrode 41 is in ohmic junction with source region 33. Preferably, source electrode 41 is in ohmic junction with contact region 34.

Interlayer insulating film 60 covers gate electrode 40. Interlayer insulating film 60 is in contact with gate electrode 40 and gate oxide film 36. Interlayer insulating film 60 electrically insulates gate electrode 40 from source electrode 41. Front surface protecting electrode 42 covers interlayer insulating film 60. Front surface protecting electrode 42 is composed of a material including Al, for example. Front surface protecting electrode 42 is electrically connected to source electrode 41.

Drain electrode 45 is provided in contact with second main surface 10b. Drain electrode 45 is composed of a material including NiSi, for example. Drain electrode 45 is in ohmic junction with silicon carbide single crystal substrate 10, for example. Backside surface protecting electrode 47 is in contact with drain electrode 45. Backside surface protecting electrode 47 is composed of a material including Al, for example. Backside surface protecting electrode 47 is electrically connected to drain electrode 45.

Figure 13:
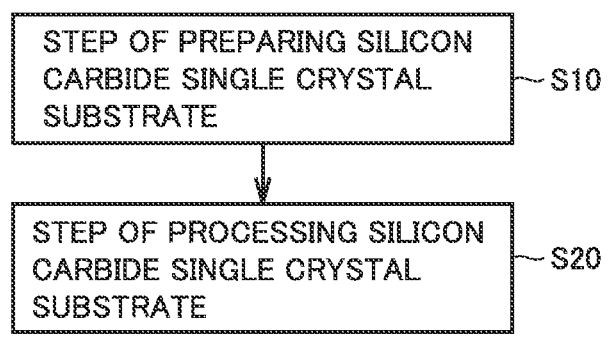
FIG. 13 is a flowchart schematically showing a method for manufacturing the silicon carbide semiconductor device according to the second embodiment.

Next, the following describes a method for manufacturing the MOSFET serving as exemplary silicon carbide semiconductor device 100. The method for manufacturing the MOSFET mainly includes: a step (S10: FIG. 13) of preparing a silicon carbide single crystal substrate; and a step (S20: FIG. 13) of processing the silicon carbide single crystal substrate. In the step (S10: FIG. 13) of preparing the silicon carbide single crystal substrate, silicon carbide single crystal substrate 10 described in the first embodiment is prepared.

Figure 14:
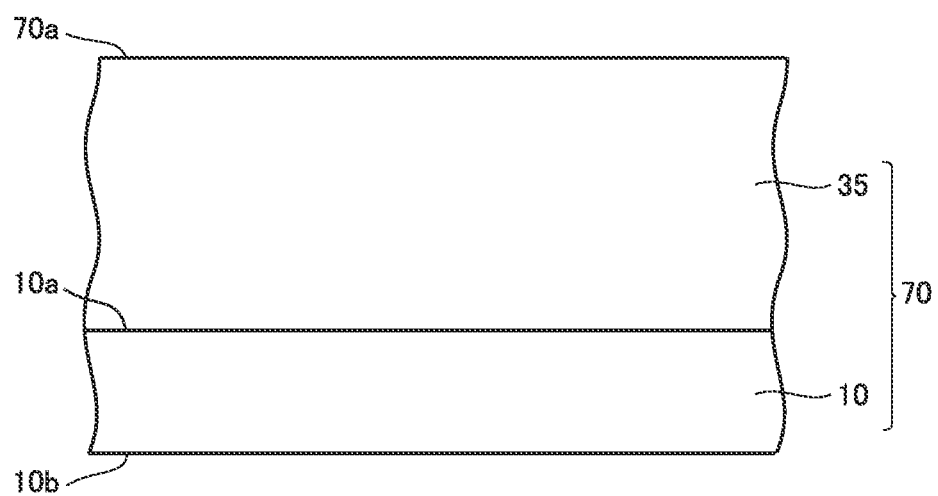
FIG. 14 is a schematic longitudinal cross sectional view showing a first step of the method for manufacturing the silicon carbide semiconductor device according to the second embodiment.

Next, the step (S20: FIG. 13) of processing the silicon carbide single crystal substrate is performed. For example, by CVD (Chemical Vapor Deposition), silicon carbide epitaxial layer 35 is epitaxially grown on first main surface 10a of silicon carbide single crystal substrate 10 (see FIG. 14). In the epitaxial growth, silane ($SiH_4$) and propane ($C_3H_8$) are used as a source material gas, whereas hydrogen ($H_2$) is used as carrier gas, for example. The temperature of silicon carbide single crystal substrate 10 during the epitaxial growth is about not less than 1400° C. and not more than 1700° C., for example. Silicon carbide single crystal substrate 10 and silicon carbide epitaxial layer 35 constitute silicon carbide substrate 70.

Figure 15:
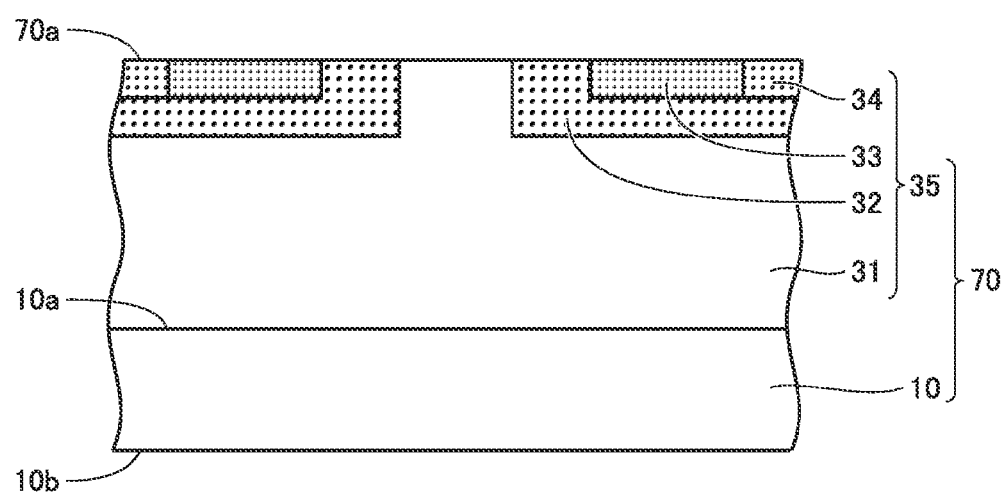
FIG. 15 is a schematic longitudinal cross sectional view showing a second step of the method for manufacturing the silicon carbide semiconductor device according to the second embodiment.

Next, an ion implantation step is performed. For example, Al (aluminum) ions are implanted into third main surface 70a of silicon carbide substrate 70, thereby forming body region 32 of p type conductivity in silicon carbide epitaxial layer 35. Next, for example, P (phosphorus) ions are implanted into body region 32 at a depth shallower than the depth in which the Al ions have been implanted, thereby forming source region 33 of n type conductivity. Next, for example, Al ions are further implanted into source region 33, thereby forming contact region 34 having p type conductivity and extending to body region 32 through source region 33. In silicon carbide epitaxial layer 35, a region in which none of body region 32, source region 33, and contact region 34 is formed serves as drift region 31 (see FIG. 15).

Next, an activation annealing step is performed. Silicon carbide substrate 70 is heated at a temperature of, for example, 1700° C. for about 30 minutes, thereby activating the impurity ions implanted in the ion implantation step. Accordingly, desired carriers are generated in the regions having the impurity ions implanted therein.

Next, a gate oxide film forming step is performed. For example, silicon carbide substrate 70 is heated in an atmosphere including oxygen, whereby gate oxide film 36 including silicon dioxide is formed on third main surface 70a of silicon carbide substrate 70. Silicon carbide substrate 70 is heated at a temperature of, for example, about 1300° C. for about 60 minutes. Gate oxide film 36 is formed in contact with each of drift region 31, body region 32, source region 33, and contact region 34 on third main surface 70a.

Figure 16:
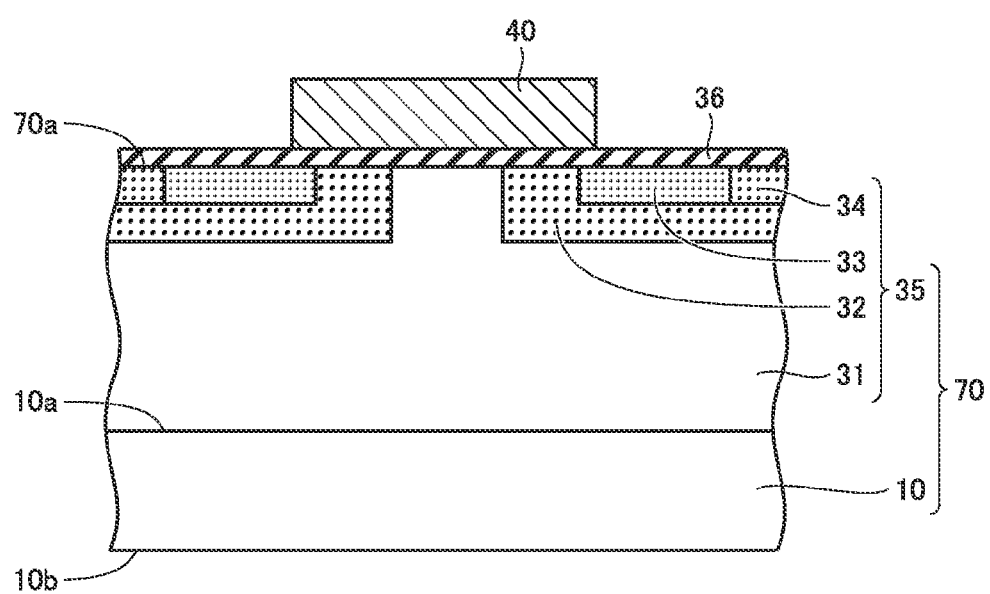
FIG. 16 is a schematic longitudinal cross sectional view showing a third step of the method for manufacturing the silicon carbide semiconductor device according to the second embodiment.

Next, a gate electrode forming step is performed. For example, by LPCVD (Low Pressure Chemical Vapor Deposition), gate electrode 40 composed of polysilicon including an impurity is formed on gate oxide film 36. Gate electrode 40 is formed at a position facing each of gate oxide film 36, source region 33, body region 32, and drift region 31 (see FIG. 16).

Figure 17:
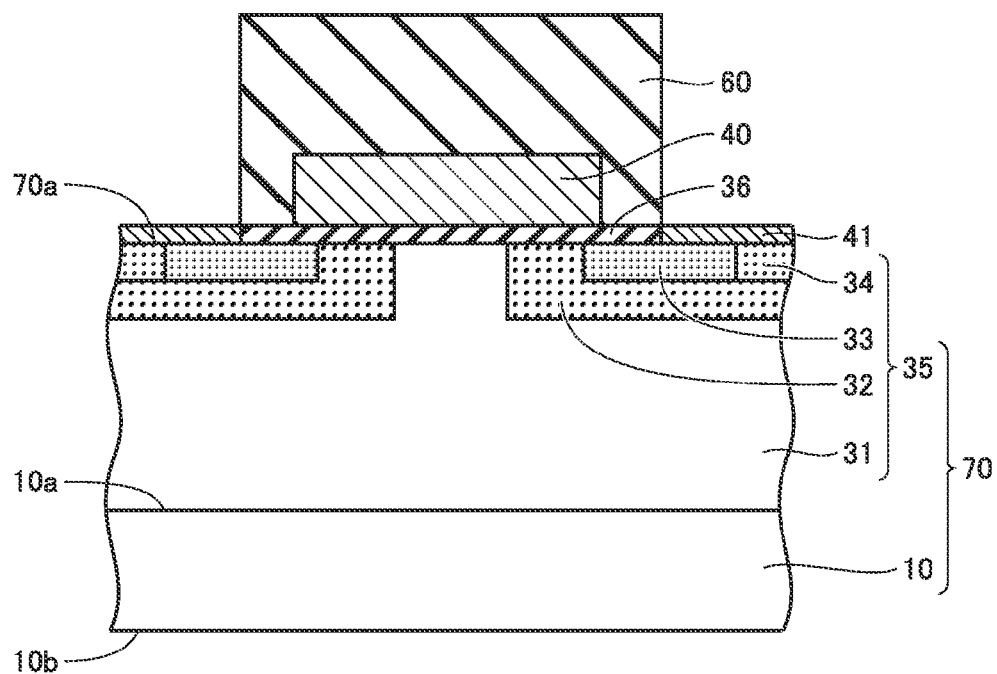
FIG. 17 is a schematic longitudinal cross sectional view showing a fourth step of the method for manufacturing the silicon carbide semiconductor device according to the second embodiment.

Next, an interlayer insulating film forming step is performed. For example, by plasma CVD, interlayer insulating film 60 is formed in contact with gate oxide film 36 to cover gate electrode 40. Interlayer insulating film 60 is composed of a material including silicon dioxide, for example. Next, a source electrode forming step is performed. For example, etching is performed to remove interlayer insulating film 60 and gate oxide film 36 from a region in which source electrode 41 is to be formed. This leads to formation of a region in which source region 33 and contact region 34 are exposed through gate oxide film 36. Next, for example, by sputtering, a metal layer including TiAlSi (titanium aluminum silicon) is formed on the region in which source region 33 and contact region 34 are exposed (see FIG. 17). Next, the metal layer is heated to, for example, about 1000° C. to result in silicidation of at least a portion of the metal layer. Accordingly, source electrode 41 is formed in ohmic junction with source region 33.

Next, a front surface protecting electrode forming step is performed. For example, by sputtering, front surface protecting electrode 42 is formed in contact with source electrode 41 to cover interlayer insulating film 60. Front surface protecting electrode 42 is composed of a material including aluminum, for example. In this way, a front surface electrode 50 including source electrode 41 and front surface protecting electrode 42 is formed in contact with third main surface 70a of silicon carbide substrate 70. Next, drain electrode 45 is formed in contact with second main surface 10b. Drain electrode 45 includes NiSi, for example. Next, backside surface protecting electrode 47 is formed in contact with drain electrode 45. Backside surface protecting electrode 47 is composed of a material including aluminum, for example. Next, silicon carbide substrate 70 is diced into a plurality of semiconductor chips.

It should be noted that the step of processing silicon carbide single crystal substrate 10 is not limited to the step described above. For example, the step of processing silicon carbide single crystal substrate 10 may be: a step of forming a semiconductor layer on silicon carbide single crystal substrate 10; a step of cutting silicon carbide single crystal substrate 10; a step of forming an electrode electrically connected to silicon carbide single crystal substrate 10; or the like.

Moreover, in the embodiment described above, it has been illustrated that the first conductivity type is n type and the second conductivity type is p type; however, the first conductivity type may be p type and the second conductivity type may be n type. In the embodiment described above, it has been illustrated that the silicon carbide semiconductor device is a MOSFET; however, the silicon carbide semiconductor device may be an IGBT (Insulated Gate Bipolar Transistor), a SBD (Schottky Barrier Diode), a LED (Light Emitting Diode), a JFET (Junction Field Effect Transistor), or the like.

Example

Silicon carbide single crystal substrates 10 are polished under polishing conditions for groups 1 to 5. Specifically, polishing apparatus 30 described in FIG. 10 is used to polish each silicon carbide single crystal substrate 10. Upper surface plate 23 is fixed whereas lower surface plate 24 is rotated. As shown in Table 1, the rotating speeds (rpm) of lower surface plate 24 for groups 1, 2, 3, 4, and 5 are respectively 30, 40, 20, 20, and 20. The relative speed ratio (the upper surface plate to the lower surface plate) of the surface plates for groups 1, 2, 3, 4, and 5 are respectively 1:2, 1:3, 1:1, 2:1, and 1:2.

The refractive indices of lubricants (slurry solutions) for groups 1, 2, 3, 4, and 5 are respectively 1.365, 1.36, 1.245, 1.245, and 1.245. The pHs of the lubricants for groups 1, 2, 3, 4, and 5 are respectively 7.6, 7.1, 7.6, 7.1, and 7.1. The Asker-C hardnesses of the polishing cloths for groups 1, 2, 3, 4, and 5 are respectively 82, 82, 82, 52, and 60. The loads (g/cm$^2$) of the upper surface plate and the lower surface plate for groups 1, 2, 3, 4, and 5 are respectively 300, 300, 200, 300, and 200. First main surfaces 10a and second main surfaces 10b of silicon carbide single crystal substrates 10 are polished under the polishing conditions above. For each group, three silicon carbide single crystal substrates 10 are produced. For example, a sample 1-1, a sample 1-2, and a sample 1-3 are silicon carbide single crystal substrates 10 produced under the polishing condition for group 1. A sample 2-1, a sample 2-2, and a sample 2-3 are silicon carbide single crystal substrates 10 produced under the polishing condition for group 2. The same applies to groups 3 to 5. Maximum diameter W (see FIG. 1) of first main surface 10a of each of silicon carbide single crystal substrates 10 is 100 mm.

TABLE 1

| Factor | Lubricant Refractive Index | pH | Hardness of Polishing Cloth Asker-C | Load (g/cm²) | Relative Speed Ratio Upper Surface Plate to Lower Surface Plate | Rotating Speed of Surface Plate (rpm) |
|---|---|---|---|---|---|---|
| Group 1 | 1.365 | 7.6 | 82 | 300 | 1:2 | 30 |
| Group 2 | 1.36 | 7.1 | 82 | 300 | 1:3 | 40 |
| Group 3 | 1.245 | 7.6 | 82 | 200 | 1:1 | 20 |
| Group 4 | 1.245 | 7.1 | 52 | 300 | 2:1 | 20 |
| Group 5 | 1.245 | 7.1 | 60 | 200 | 1:2 | 20 |

Next, TTV, LTV, and LTIR of each of silicon carbide single crystal substrates 10 polished in accordance with the polishing methods for corresponding groups are measured. The TTV, LTV, and LTIR are measured using "Tropel FlatMaster®" provided by Corning Tropel. The definitions of the TTV, LTV, and LTIR are described in the above-described embodiment. First main surface 10a is observed optically with the entire surface of second main surface 10b being made flat as a result of being adsorbed onto a vacuum chuck, thereby measuring the TTV, LTV, and LTIR. The LTV and LTIR are measured in each of central square region 1 and outer square region 2 of first main surface 10a. The definitions of central square region 1 and outer square region 2 are described in the above-described embodiment.

Each of Table 2 and Table 3 shows results of measurement of: the TTV; the LTV in central square region 1 (indicated as LTV(central) in Table 2 and Table 3); the LTV in outer square region 2 (indicated as LTV(outer) in Table 2 and Table 3); the LTIR in central square region 1 (indicated as LTIR(central) in Table 2 and Table 3); and the LTIR in outer square region 2 (indicated as LTIR(outer) in Table 2 and Table 3). A LTV(outer)/LTV(central) is calculated by dividing the LTV(outer) by the LTV(central). A LTIR(central)/ LTV(central) is calculated by dividing the LTIR(central) by the LTV(central). A LTIR(outer)/LTV(outer) is calculated by dividing the LTIR(outer) by the LTV(outer).

TABLE 2

| Group | 1 | | | 2 | | |
|---|---|---|---|---|---|---|
| Sample | 1-1 | 1-2 | 1-3 | 2-1 | 2-2 | 2-3 |
| TTV [µm] | 1.24 | 1.24 | 1.30 | 1.23 | 1.26 | 1.15 |
| LTV(central) [µm] | 0.48 | 0.33 | 0.42 | 0.36 | 0.31 | 0.52 |
| LTV(outer) [µm] | 0.75 | 0.77 | 0.80 | 0.59 | 0.60 | 0.59 |
| LTIR(central) [µm] | 0.42 | 0.31 | 0.39 | 0.34 | 0.29 | 0.42 |
| LTIR(outer) [µm] | 0.60 | 0.66 | 0.69 | 0.51 | 0.52 | 0.48 |
| LTV(outer)/LTV(central) | 1.56 | 2.33 | 1.90 | 1.64 | 1.94 | 1.13 |
| LTIR(central)/LTV(central) | 0.88 | 0.94 | 0.93 | 0.94 | 0.94 | 0.81 |
| LTIR(outer)/LTV(outer) | 0.80 | 0.86 | 0.86 | 0.86 | 0.87 | 0.81 |

Table 2 shows the TTV, LTV(outer)/LTV(central), LTIR (central)/LTV(central), and LTIR(outer)/LTV(outer) of each of the samples produced under the polishing conditions for groups 1 and 2. As shown in Table 2, the TTV of each of silicon carbide single crystal substrates 10 for sample 1-1 to sample 2-3 is not less than 1.15 and not more than 1.30. That is, the TTV of each of silicon carbide single crystal substrate 10 for sample 1-1 to sample 2-3 is not more than 5. The LTV(outer)/LTV(central) of each of silicon carbide single crystal substrates 10 for sample 1-1 to sample 2-3 is not less than 1.13 and not more than 2.33. That is, the LTV(outer)/ LTV(central) of each of silicon carbide single crystal substrates 10 for samples 1-1 to sample 2-3 is not less than 1 and not more than 3. The LTIR(central)/LTV(central) of each of silicon carbide single crystal substrates 10 for sample 1-1 to sample 2-3 is not less than 0.80 and not more than 0.87. That is, the LTIR(central)/LTV(central) of each of silicon carbide single crystal substrates 10 for sample 1-1 to sample 2-3 is not less than 0.8 and not more than 1.2. The LTIR(outer)/ LTV(outer) of each of silicon carbide single crystal substrates 10 for sample 1-1 to sample 2-3 is not less than 0.80 and not more than 0.87. That is, the LTIR(outer)/LTV(outer) of each of silicon carbide single crystal substrates 10 for sample 1-1 to sample 2-3 is not less than 0.8 and not more than 1.2.

TABLE 3

| Group | 3 | | | 4 | | | 5 | | |
|---|---|---|---|---|---|---|---|---|---|
| Sample | 3-1 | 3-2 | 3-3 | 4-1 | 4-2 | 4-3 | 5-1 | 5-2 | 5-3 |
| TTV [µm] | 2.11 | 1.99 | 1.57 | 2.7 | 3.07 | 4.33 | 2.19 | 2.35 | 2.00 |
| LTV(central) [µm] | 0.36 | 1.15 | 0.52 | 0.45 | 0.69 | 1.09 | 1.31 | 0.62 | 0.64 |
| LTV(outer) [µm] | 1.43 | 0.64 | 0.84 | 1.41 | 1.63 | 1.82 | 1.36 | 1.42 | 1.36 |
| LTIR(central) [µm] | 0.23 | 0.85 | 0.36 | 0.67 | 0.45 | 0.67 | 0.65 | 0.48 | 0.36 |
| LTIR(outer) [µm] | 1.11 | 0.44 | 0.53 | 1.08 | 1.13 | 1.38 | 1.11 | 0.97 | 0.99 |
| LTV(outer)/LTV(central) | 3.97 | 0.56 | 1.62 | 3.13 | 2.36 | 1.67 | 1.04 | 2.29 | 2.12 |
| LTIR(central)/LTV(central) | 0.64 | 0.74 | 0.69 | 1.49 | 0.65 | 0.61 | 0.50 | 0.77 | 0.56 |
| LTIR(outer)/LTV(outer) | 0.78 | 0.69 | 0.63 | 0.77 | 0.69 | 0.76 | 0.82 | 0.68 | 0.73 |

Table 3 shows the TTV, LTV(outer)/LTV(central), LTIR (central)/LTV(central), and LTIR(outer)/LTV(outer) of each of the samples produced under the polishing conditions for groups 3, 4, and 5. As shown in Table 3, the TTV of each of silicon carbide single crystal substrates 10 for sample 3-1 to sample 5-3 is not less than 1.57 and not more than 4.33. That is, the TTV of each of silicon carbide single crystal substrates 10 produced under the polishing conditions for groups 3, 4, and 5 is larger than the TTV of each of silicon carbide single crystal substrates 10 produced under the polishing conditions for groups 1 and 2.

The LTV(outer)/LTV(central) of silicon carbide single crystal substrate 10 for sample 3-2 is less than 1. The LTV(outer)/LTV(central) of each of silicon carbide single crystal substrates 10 for sample 3-1 and sample 4-1 is larger than 3. The LTIR(central)/LTV(central) of each of silicon carbide single crystal substrates 10 for sample 3-1, sample 3-2, sample 3-3, sample 4-2, sample 4-3, sample 5-1, sample 5-2, and sample 5-3 is less than 0.8. The LTIR(central)/LTV(central) of silicon carbide single crystal substrate 10 for sample 4-1 is larger than 1.2. The LTIR(outer)/LTV(outer) of each of silicon carbide single crystal substrates 10 for sample 3-1, sample 3-2, sample 3-3, sample 4-1, sample 4-2, sample 4-3, sample 5-2, and sample 5-3 is less than 0.8.

In view of the above results, by employing the polishing conditions for groups 1 and 2, it is possible to manufacture a silicon carbide single crystal substrate 10 in which the LTIR(central)/LTV(central) is not less than 0.8 and not more than 1.2 and the LTV(outer)/LTV(central) is not less than 1 and not more than 3.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: central square region; 2: outer square region; 3: second outer square region; 4: third outer square region; 5: fourth outer square region; 6: flaw; 10: silicon carbide single crystal substrate; 10a: first main surface; 10b: second main surface; 10c: outer edge; 11: outer gear; 12: carrier; 12a: pocket; 13: inner gear; 21, 22: polishing cloth; 23: upper surface plate; 24: lower surface plate; 25, 26: shaft; 30: polishing apparatus; 31: drift region; 32: body region; 33: source region; 34: contact region; 35: silicon carbide epitaxial layer; 36: gate oxide film; 40: gate electrode; 41: source electrode; 42: front surface protecting electrode; 45: drain electrode; 47: backside surface protecting electrode; 50: front surface electrode; 60: interlayer insulating film; 70: silicon carbide substrate; 70a: third main surface; 100: silicon carbide semiconductor device (MOSFET); A1, A4, A6: maximum point; A2, A3, A5: minimum point; C2, C3, C4, C5: position; G: center of gravity; L1, L2: straight line; L3, L4, L6, L7, L9, L10: plane; L5: least squares plane; O1: intersection; O2, O3, O4, O5: center; R1, R2, R3, R4, R5: rotation direction; T1, T2, T3, T4, T5, T6: height; TD: thickness direction; W: maximum diameter.

The invention claimed is:

1. A silicon carbide single crystal substrate comprising a first main surface and a second main surface opposite to the first main surface,
the first main surface including
a central square region surrounded by a square having a center corresponding to an intersection between the first main surface and a straight line that passes through a center of gravity of the silicon carbide single crystal substrate and that is parallel to a thickness direction of the silicon carbide single crystal substrate, and
an outer square region surrounded by a square that has a side parallel to a straight line perpendicular to a straight line connecting the intersection to a certain position on an outer edge of the first main surface and that has a center corresponding to a position separated away by 10.5 mm from the certain position toward the intersection,
when viewed in the thickness direction, each of the central square region and the outer square region having a side having a length of 15 mm,
the first main surface having a maximum diameter of not less than 100 mm,
the silicon carbide single crystal substrate having a TTV of not more than 5 μm,
a value obtained by dividing a LTIR in the central square region by a LTV in the central square region being not less than 0.8 and not more than 1.2,
a value obtained by dividing a LTV in the outer square region by the LTV in the central square region being not less than 1 and not more than 3.

2. The silicon carbide single crystal substrate according to claim 1, wherein the maximum diameter is not less than 150 mm.

3. The silicon carbide single crystal substrate according to claim 2, wherein the maximum diameter is not less than 200 mm.

4. The silicon carbide single crystal substrate according to claim 1, wherein
a flaw having a depth of not less than 0.5 nm in the thickness direction is formed in the first main surface, and
the flaw has an area density of not more than $0.085/cm^2$.

5. The silicon carbide single crystal substrate according to claim 1, wherein a value obtained by dividing a LTIR in the outer square region by the LTV in the outer square region is not less than 0.8 and not more than 1.2.

6. A silicon carbide semiconductor device comprising the silicon carbide single crystal substrate recited in claim 1.

7. A method for manufacturing a silicon carbide semiconductor device, the method comprising:
preparing the silicon carbide single crystal substrate recited in claim 1; and
processing the silicon carbide single crystal substrate.

* * * * *